United States Patent [19]
Akio

[11] Patent Number: 5,691,548
[45] Date of Patent: Nov. 25, 1997

[54] SOLID STATE IMAGING DEVICE HAVING HIGH SENSITIVITY AND EXHIBITING HIGH DEGREE OF LIGHT UTILIZATION AND METHOD OF MANUFACTURING THE SAME

[75] Inventor: Tetsuro Akio, Fukuyama, Japan

[73] Assignee: Sharp Kabushiki Kaisha, Osaka, Japan

[21] Appl. No.: 641,203

[22] Filed: Apr. 30, 1996

Related U.S. Application Data

[63] Continuation of Ser. No. 314,231, Sep. 28, 1994, abandoned.

[30] Foreign Application Priority Data

Sep. 28, 1993 [JP] Japan ................... 5-241030

[51] Int. Cl.⁶ ................... H01L 27/148; H01L 29/768; H01L 31/0232
[52] U.S. Cl. ................... 257/232; 257/233; 257/432
[58] Field of Search ................... 257/232, 233, 257/432

[56] References Cited

U.S. PATENT DOCUMENTS 5,371,397  12/1994  Maegawa et al. ................... 257/233

FOREIGN PATENT DOCUMENTS

| 2-103962 | 4/1990 | Japan . |
| 2-280376 | 11/1990 | Japan . |
| 4-199874 | 7/1992 | Japan ................... 257/440 |
| 4-278582 | 10/1992 | Japan ................... 257/432 |

Primary Examiner—Ngân V. Ngô
Attorney, Agent, or Firm—David G. Conlin; Brian L. Michaelis

[57] ABSTRACT

There are provided a solid state imaging device having high sensitivity and exhibiting high degree of light utilization and a method of manufacturing the same. An insulating film 42, a transfer electrode 43, a light shielding film 44, a protective film 45, and a flat layer 51 are formed above a layer having a photoelectric conversion portion, and a concave lens layer 52 is formed on the flat layer 51 to a lattice pattern. The concave lens layer 52 of the lattice pattern is hot melted for conversion into a concave type micro-lens 52. A resin layer 53 having a refractive index smaller than that of the concave lens 52, a buffer layer 54, and a convex type micro-lens 57 are sequentially formed above the concave type micro-lens 52. The concave type micro-lens 52 functions to bring light rays focused by the convex type micro-lens 57 to a position close to light incident vertically upon the photoelectric conversion portion 41.

3 Claims, 11 Drawing Sheets

Number of Momentarily Generated Signal Electrons (electron/cm)  edge   center   edge
                    Position →

SOLID STATE IMAGING DEVICE HAVING HIGH SENSITIVITY AND EXHIBITING HIGH DEGREE OF LIGHT UTILIZATION AND METHOD OF MANUFACTURING THE SAME

This application is a continuation of application Ser. No. 08/314,231 filed on Sep. 28, 1994, now abandoned.

BACKGROUND OF THE INVENTION

1. Field of the Invention

The present invention relates generally to a solid state imaging device and a method of manufacturing the same and, more particularly, to a solid state imaging device having a photoelectric conversion portion and a micro-lens formed thereon, and a method of manufacturing the same.

2. Description of the Prior Art

Recently, in the art of solid state imaging devices, the use of micro-lenses has resulted in remarkable improvement in sensitivity.

Conventionally, there has been provided a solid state imaging devices as shown in FIG. 8A for a slid state imaging device having a micro-lens. FIG. 8A illustrates an optical system in a unit pixel of the solid state imaging device. In FIG. 8A, a reference numeral 181 donates a photoelectric conversion portion, 182 donates an interlayer insulating film, 183 indicates transfer electrodes for signal charge transfer, 184 indicates light shielding portions disposed above respective transfer electrodes, 185 represents a protective film, 186 represents a transparent resin layer or micro-lens support layer, and 187 represents a micro-lens. Shown by 188 is a vertical incident light at a lens edge, and by 189 is an oblique incident light.

As FIG. 8A shows, the solid state imaging device is such that the vertical incident light 188 is conducted by the micro-lens 187 to the photoelectric conversion portion 181 so as to provide for sensitivity improvement.

FIGS. 8B and 8C show the condition of light incidence upon the photoelectric conversion portion in the conventional solid state imaging device. In FIG. 8B, a reference numeral 190 designates an incident light beam at an ordinary diaphragm position, 191 designates an effective photoelectric conversion area, 192 designates an area of actual photoelectric conversion, and 193 designates a long wave light ray of oblique incidence reaching the proximity of a signal charge transfer region upon release of a stop. Shown by 194 is a virtual aperture stop comprised of a light-shielding film or the like.

Today, solid state imaging devices are used in a very wide range of applications including, for example, video movies and monitoring cameras. Indeed, this versatility in use requires adaptation to all kinds of optical applications.

In various applications, it has been found that an optical change within an optical system, such as stop changing of the camera lens optics, which was not taken up as a problem in any serious way in the past, has an important bearing upon image quality, image plane brightness, and the like. In this conjunction, solid state imaging devices of the above described type have drawbacks as explained hereinbelow.

In such prior art solid state imaging device, micro-lens optics is often so designed as to best suit the condition in which the stop for the lens optics is set rather narrow. That is, a design has been considered most ideal such that vertical incident light 188 at a lens edge, as in FIG. 8A, is allowed to enter the photoelectric conversion portion without eclipse.

However, when lenses are used in a condition close to open aperture as in the case of imaging in a dark room, obliquely incident light rays as designated by reference numeral 189 in FIG. 8A will noticeably increase in their proportions to the total amount of all incident light rays. As a consequence, light rays that fail to enter the photoelectric conversion portion 181 due to an eclipse caused by a structural member peripheral to the aperture will proportionally increase, which results in a virtual decrease in optical sensitivity.

Where the solid state imaging device is a color imaging device, this involves another problem that white balance may be unfavorably affected.

In this way, conventional solid state imaging devices of the foregoing type are likely to involve image quality degradation due to changes in imaging conditions.

In such prior art solid state imaging devices, the micro-lens configuration is such that, as FIGS. 8B and 8C show, a spatial range 192 in which an incident light beam passes through a photoelectric conversion portion 191 is limited to the vicinity of the center of the photoelectric conversion portion 191. Therefore, carriers generated are locally forced into a condition close to oversaturation at a center portion of the photoelectric conversion portion, and the transition probability of electron in that portion is likely to decrease on the order of carrier diffusion time. The reason for this may be that, as a matter of basic rule, a completely depleted portion has a highest transition probability of electron.

Generally, the photoelectric conversion portion 191 itself is an N-type layer, and the peripheral part of the photoelectric conversion portion 191 is surrounded by a P-type layer. Therefore, the peripheral part of the photoelectric conversion portion 191 have a higher potential gradient and a higher transition probability of electron. As already stated, however, the prior art solid state imaging device of the above described type has a drawback that such peripheral part cannot be used for photoelectric conversion. As such, from the standpoint of sensitivity, the prior art device is far from being said to be effective.

An incident light ray which has passed through the micro-lens is basically allowed to go obliquely into the photoelectric conversion portion. Therefore, when penetration depth (5–10 µm) of long-wave light rays of a visible light range into a substrate including the photoelectric conversion portion is considered, there are no few probabilities that photoelectric conversion is effected with respect to the incident light within a signal charge transfer portion adjacent to the photoelectric conversion portion or at a location very close to the signal charge transfer portion. This cannot necessarily be said to be satisfactory from the standpoint of smear inhibition.

Therefore, in order to optimize the imaging conditions, it is necessary to match the photoelectric conversion region to the micro-lens optics.

When a single lens is considered, it is generally said that assuming the lens diameter (which diameter may be considered to be the diameter of an entrance pupil) is constant, the shorter its focal length, the brighter the lens is. That is, such a lens provides higher illuminance on the image field. In more simple terms, the greater the lens curvature, the higher the sensitivity of the device is. Therefore, prior art devices are equipped with a micro-lens having a relatively large curvature.

However, if the curvature of the micro-lens is increased, at peripheral edge portions of the micro-lens, the angle of incidence of an incident light ray at a point where the light enters the lens is rendered greater relative to the tangential plane of the lens. Then, as illustrated in FIG. 10 which shows reflectance Rs of s component and reflectance Rp of p component relative to a material having an refractive index of 1.6, a usual problem is that when the angle of incidence θ is more than about 60°, the reflectance involved will be intolerably high (e. g., Rs=about 21% as in the case shown), that is, the reflection of light on the surface of the micro-lens is intolerably high. This results in decreased sensitivity.

In this way, the prior art devices involve a problem yet to be solved also with respect to the utilization of light as recited above.

SUMMARY OF THE INVENTION

Accordingly, it is an object of the present invention to provide a solid state imaging device which has high sensitivity and can exhibit high degree of light utilization, and a method of manufacturing the same.

In order to accomplish the object, there is provided a solid state imaging device having a plurality of pixels including a photoelectric conversion portion and a convex type micro-lens disposed above the photoelectric conversion portion, the device comprising:

a support layer formed between the photoelectric conversion portion and the convex type micro-lens for supporting the convex type micro-lens; and a concave type micro-lens layer disposed between the support layer and the photoelectric conversion portion, said concave type micro-lens layer being formed of a material having a refractive index higher than that of the support layer.

The solid state imaging device is designed so that the concave type micro-lens layer operates to collimate light rays collected by the convex lens so as to allow them to come closer to light rays incident vertically on the photoelectric conversion portion.

By collimating the collected light rays it is possible to prevent the collected rays from impinging on a diaphragm which surrounds a space present opposite to and above the photoelectric conversion portion. This results in sensitivity improvement.

Collimating the collected light rays also results in an increase in the area over which a beam composed of the collected light rays enters the photoelectric conversion portion. This, in turn, results in an increase in the effective utilization area of the photoelectric conversion portion and in increased sensitivity.

There is further provided a concave type lens seating layer disposed between the concave type micro-lens layer and the support layer for supporting the support layer; and wherein material of the convex type micro-lens, that of the support layer, and that of the concave type micro-lens layer being all designed to have a refractive index higher than that of material of the concave type lens seating layer.

The solid state imaging device is so designed that the concave type micro-lens layer operates to collimate light rays collected by the convex lens so as to allow them to come closer to light rays incident vertically on the photoelectric conversion portion.

The material of the convex type micro-lens, that of the support layer, and that of the concave type micro-lens layer have a refractive index higher than that of the material of the concave type lens seating layer, so that a bundle of light rays converged by the convex type micro-lens will in no case be diverged by the concave type lens seating layer. This provides for improvement in light collecting characteristics.

Because the concave type lens seating layer made of the material having lower refractive index relative to the support layer is provided immediately under the support layer, the curvature of the convex micro-lens can be made smaller than in case of no such concave type lens seating layer being provided, without involving any increase in focal distance. Therefore, reflection of incident light from the surface of the convex micro-lens can be reasonably prevented.

There is provided a method of manufacturing a solid state imaging device wherein a concave type micro-lens layer, a support layer, and a convex type micro-lens are sequentially formed on a photoelectric conversion portion, the method comprising the steps of:

forming a flat layer of transparent material above the photoelectric conversion portion, said transparent material having a refractive index higher than that of each of the convex type micro-lens and the support layer;

forming a lattice pattern layer of photosensitive resin material over the surface of the flat layer, said lattice pattern layer having a through-hole opposite to the photoelectric conversion portion;

hot-melting the lattice pattern layer to convert the lattice pattern layer into a concave type micro-lens pattern layer having a plurality of concave portions of a concave type micro-lens configuration; and etching the concave type micro-lens pattern layer, thereby transferring the concave type micro-lens configuration of the concave type micro-lens pattern layer onto the flat layer underlying the concave type micro-lens pattern layer so that the flat layer is converted into the concave type micro-lens layer.

According to the method of manufacturing a solid state imaging device, the lattice pattern layer is hot melted for being formed into the concave type micro-lens pattern layer, and then the concave type micro-lens pattern layer is etched so that the concave micro-lens configuration is transferred onto the flat layer for provision of the concave type micro-lens layer. The solid state imaging device of the invention is thus manufactured.

There is provided a method of manufacturing a solid state imaging device wherein a concave type micro-lens layer, a lens seating layer, and a convex type micro-lens are sequentially formed above a photoelectric conversion portion, the method comprising the steps of:

forming a lattice pattern layer of photosensitive resin material above the photoelectric conversion portion so as to enable lens formation, said photosensitive resin material having light transmission and a refractive index higher than that of constituent material of the lens seating layer, said lattice pattern layer having a through-hole opposite to the photoelectric conversion portion; and hot-melting the lattice pattern layer, then thermosetting the hot melt lattice pattern layer, whereby the lattice pattern layer is converted into the concave type micro-lens layer.

According to the above method, the lattice pattern layer is hot melted so that the lattice pattern layer is formed into the concave type micro-lens layer. Thus, the solid state imaging device is manufactured.

There is provided a method of manufacturing a solid state imaging device wherein a concave type micro-lens layer, a support layer, and a convex type micro-lens are sequentially formed above a photoelectric conversion portion, the method comprising the steps of:

forming a lattice pattern layer above the photoelectric conversion portion by patterning a photosensitive resin material to a lattice configuration and curing the same, said lattice pattern layer having a through-hole opposite to the photoelectric conversion portion; and forming an overcoat layer made of transparent resin on the lattice pattern layer so that the overcoat layer may be operative to be the concave type micro-lens layer.

According to the above method, the concave type micro-lens layer can be formed without involving the step of hot melting the lattice pattern layer. This permits formation of the concave type micro-lens layer with good reproducibility

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The solid state imaging device and the method of manufacturing the same will now be described in further detail with reference to the accompanying drawings.

Figure 9A:
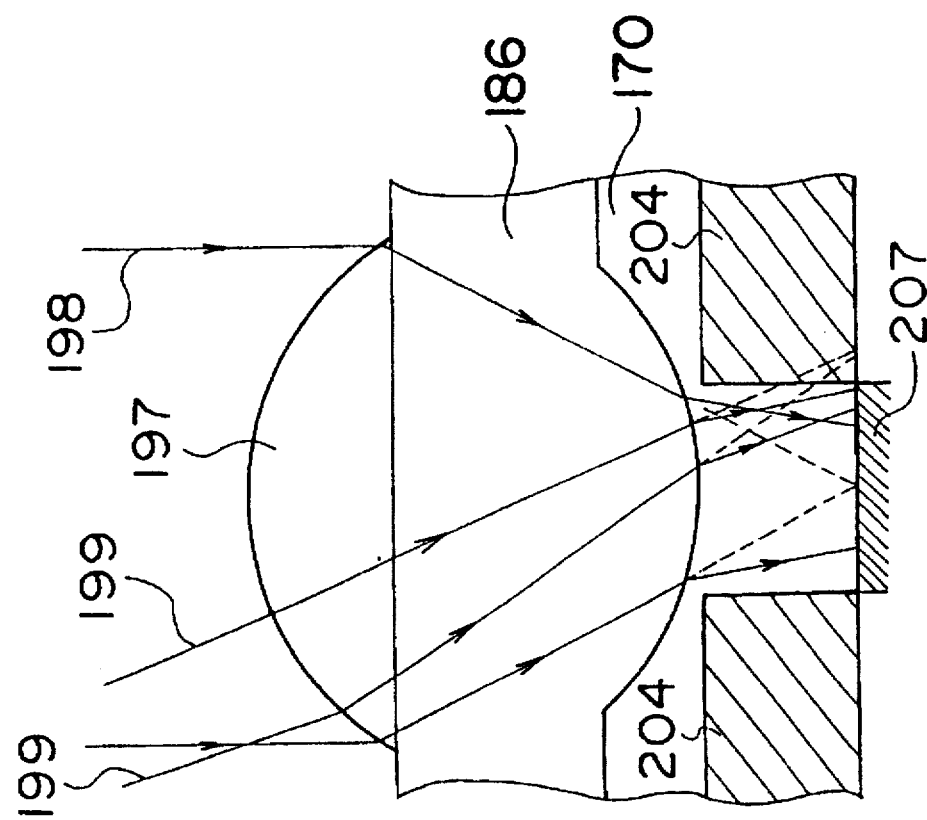
FIGS. 9A and 9B are also views showing the function of focusing in the prior art and the function of focusing in the present invention in comparison.
Figure 9B:
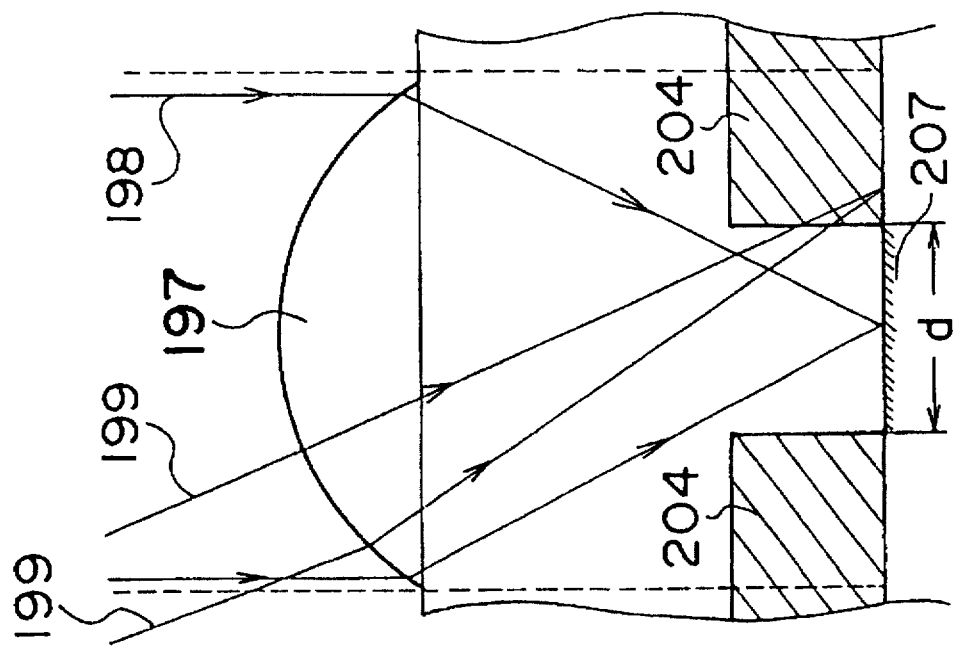
Figure 10:
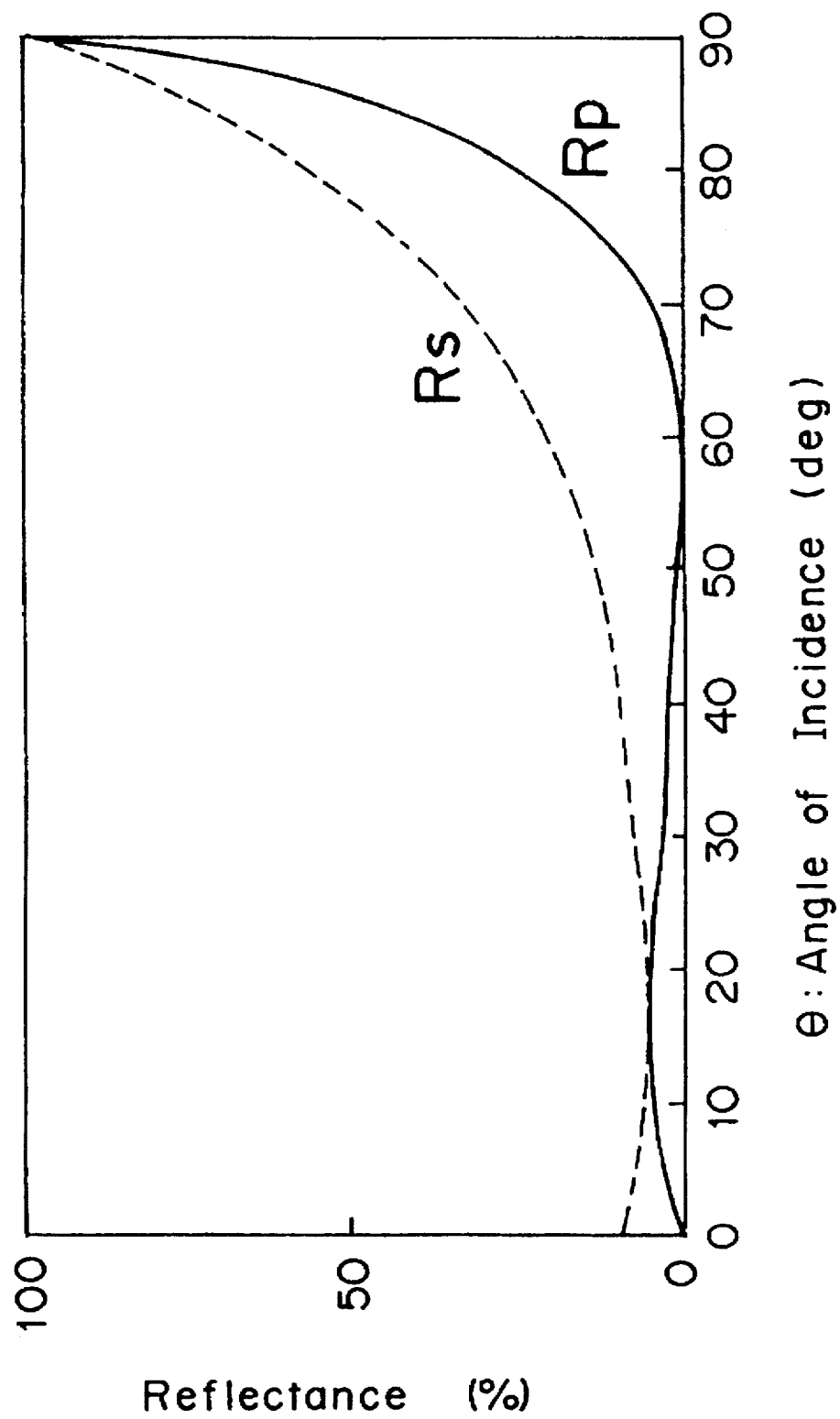
FIG. 10 is a characteristic view showing reflectance of light incident on material having a refractive index of 1.6 and dependence of the reflectance upon angle of incidence.

First, for purposes of comparing the present invention with the prior art, a sectional model of a prior art unit pixel is shown in FIG. 9A, and a typical sectional model of the invention is shown in FIG. 9B. With respect to both the prior art model shown in FIG. 9A and the model of the invention shown in FIG. 9B, their respective virtual diaphragms, apertures and convex type micro-lenses are respectively formed as being of identical dimensions. As FIG. 9B shows, the model of the invention includes a concave type micro-lens layer 170 disposed immediately below the convex type micro-lens 197, in which respect only the model of the invention is different from the prior art model.

In FIGS. 9A and 9B, reference numerals 198, 199 designate light of vertical incidence at a micro-lens edge portion and light of oblique incidence respectively. In the prior art model shown in FIG. 9A, it is designed that the light of vertical incidence 198 will focus on the center of the surface of a photoelectric conversion area d. In contrast to this, the model of the invention in FIG. 9B is so designed that the light of vertical incidence 198 is refracted by the concave type micro-lens 170 so that light beams of vertical incidence will diverge widely over the photoelectric conversion area.

In the prior art model of FIG. 9A, the light of oblique incidence is obstructed by a diaphragm 204 so that it will not enter a photoelectric conversion portion 207. In contrast, in the model of the invention shown in FIG. 9B, the light of oblique incidence 199 is refracted by the concave micro-lens 195 to enter the photoelectric conversion portion 207.

Figure 8A:
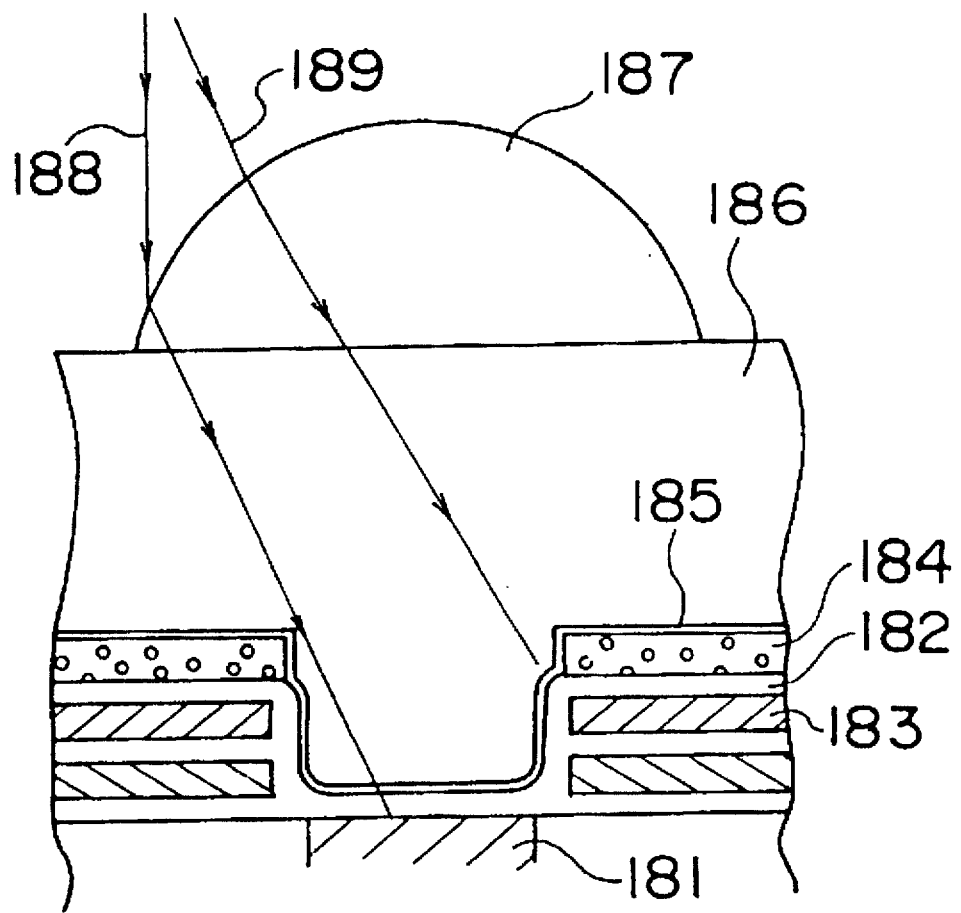
FIGS. 8A, 8B and 8C are views showing the function of focusing in the prior art.
Figure 8B:
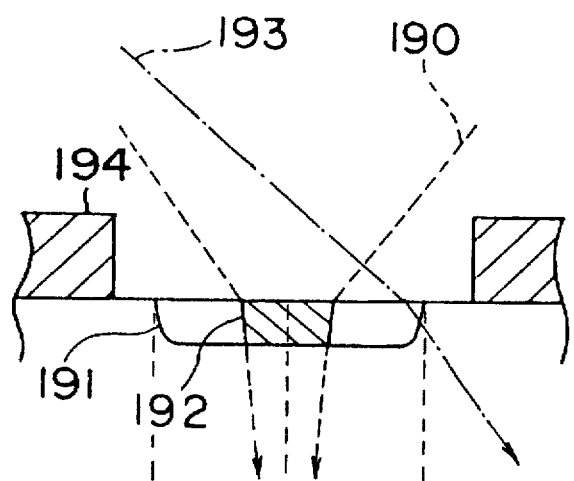
Figure 8C:
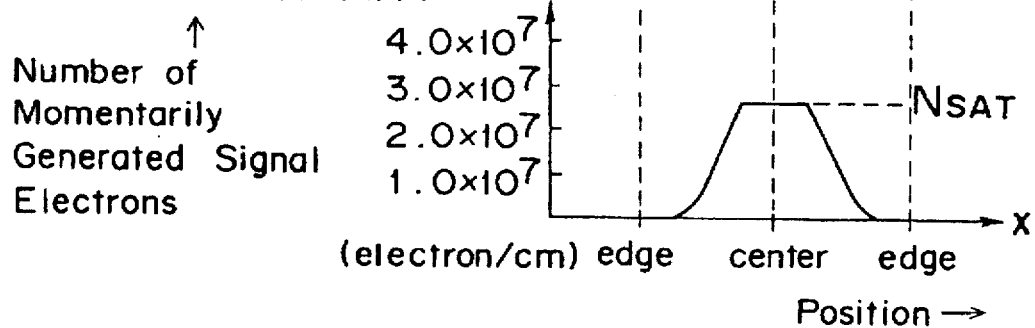
Figure 8D:
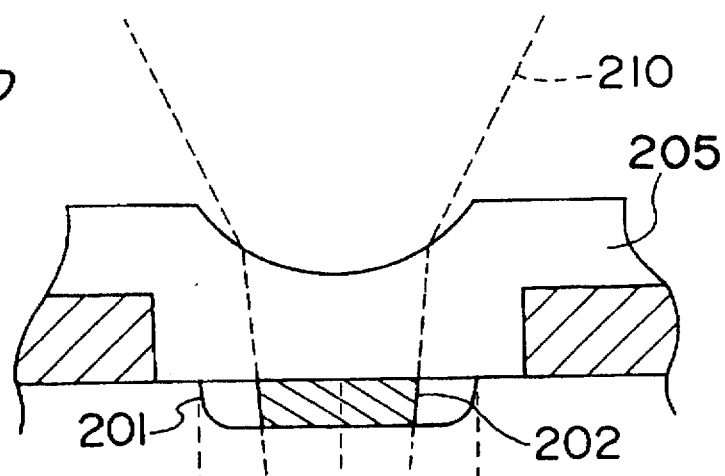
FIGS. 8D and 8E are views showing the function of focusing in the present invention.
Figure 8E:
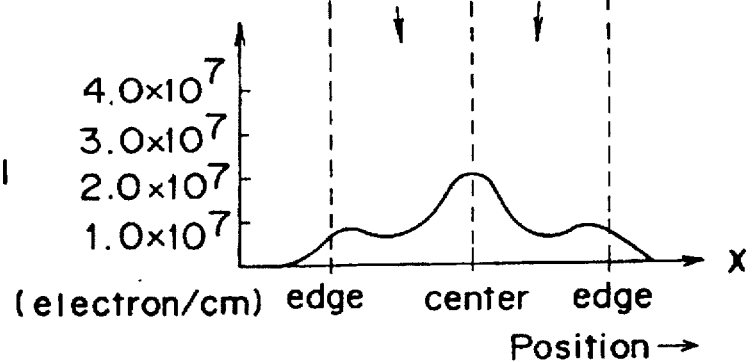

Referring next to FIGS. 8A, 8B, 8C, 8D and 8E comparison is made between the prior art and the present invention. As FIG. 8A shows, a geometry of each unit pixel of a solid state imaging device includes effective diaphragms comprised of light shielding films 184 and electrodes 183. FIGS. 8B and 8C represent a prior art arrangement which corresponds to FIG. 8A. FIGS. 8D and 8E represent the present invention.

According to the arrangement of the present invention, wherein a concave micro-lens 205 of high refractive index is formed immediately above a photoelectric conversion portion including an effective photoelectric conversion area 201, as FIG. 8D illustrates, a bundle of light rays 210, refracted by a convex micro-lens (not shown) disposed above the concave micro-lens 205, begins to converge toward a focal point of the convex micro-lens, the bundle of rays 210 being then refracted by the concave micro-lens 205 so that it is brought closer to a vertically parallel condition. Therefore, according to the invention, the incident bundle of light rays which is refracted by the convex micro-lens into the process of converging is so oriented by the concave micro-lens that individual rays come closer to a directionally parallel condition, being thus converted into a bundle of substantially parallel rays having a sectional area approximating to that of the photoelectric conversion portion. According to the invention, therefore, the proportion of a light beam passage area 202 in an effective photoelectric conversion area 201 is made greater than that in the prior art. In other words, the utilization of the effective photoelectric conversion area is enhanced and sensitivity improvement is achieved.

The solid state imaging device of the invention comprises a concave micro-lens disposed immediately under the convex micro-lens and the support layer therefor, the concave micro-lens being formed of a transparent resin material having a higher refractive index than the convex micro-lens and support layer. Therefore, any light beam that has passed through the convex micro-lens and is in converged condition can be collimated above the photoelectric conversion portion into parallel light rays.

In the forgoing arrangement of the invention, the support layer for the convex micro-lens is made of a transparent resin material having a lower refractive index as compared with both the convex micro-lens and the concave type micro-lens layer. This will further enhance the collimation of rays. A flat layer of transparent resin having lower refractive index relative to the convex micro-lens and support layer may be provided as an intermediate layer immediately under the support layer.

(First Embodiment)

Figure 1A:
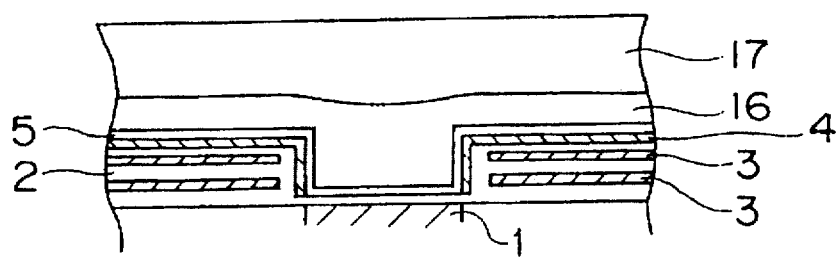
FIGS. 1A, 1B, 1C, 1D and 1E are flow diagrams for explaining a first embodiment of the method of manufacturing a solid state imaging device according to the present invention.
Figure 1B:
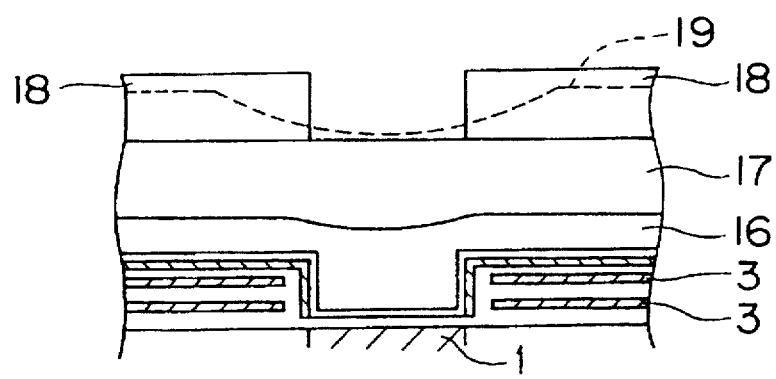

FIGS. 1A to 1B illustrate by way of example one method of manufacturing a solid state imaging device in accordance with the present invention. It is noted that in FIG. 1 is shown a cell configuration representing a unit pixel of the solid state imaging device.

As FIG. 1A shows, transfer electrodes 3 are first formed on a substrate including a photoelectric conversion portion 1, on a region which is not opposite to the photoelectric conversion portion 1, with interposition of an interlayer insulating film 2. A shielding film 4 is provided for covering the transfer electrodes 3, and then a protective film 5 is provided for covering both the shielding film 4 and the photoelectric conversion portion 1. The protective film 5 is intended to protect a base monochromatic device. Immediately after the protective film 5 is formed, annealing is carried out in a hydrogen atmosphere. This process of annealing represents one way of interface level relaxation from a lattice misalignment at the interface between an active region of the photoelectric conversion portion 1 and an oxide film. A leveling layer 16 is formed over the protective layer 5. The leveling layer 16 is comprised of a hot-melt type low-melting glass or an SOG (spin-on glass) film and is intended for equalizing any surface irregularity due to the transfer electrodes 3 and the like. On the leveling layer 16 is formed a silicon nitride layer 17 of silicon nitride by chemical vapor deposition or the like, the silicon nitride layer having a thickness of about 1.5 μm. The thickness of the silicon nitride layer 17 may vary depending upon the degree of the surface irregularity, but is generally set within a range of 1.5 to 2.0 μm. The refractive index of the silicon nitride layer 17 may differ according to the conditions of growth for the silicon nitride layer 17, but usually it is not less than 2.0. The silicon nitride layer 17 is formed into a concave micro-lens having high refractive index through subsequent steps.

Figure 2:
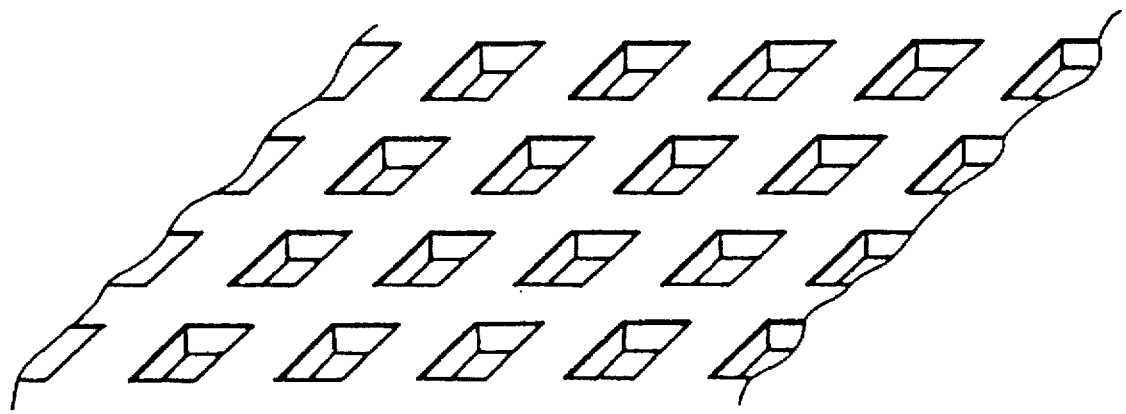
FIG. 2 is a perspective view of a lattice pattern resist with pixel areas formed as extending therethrough.
Figure 3:
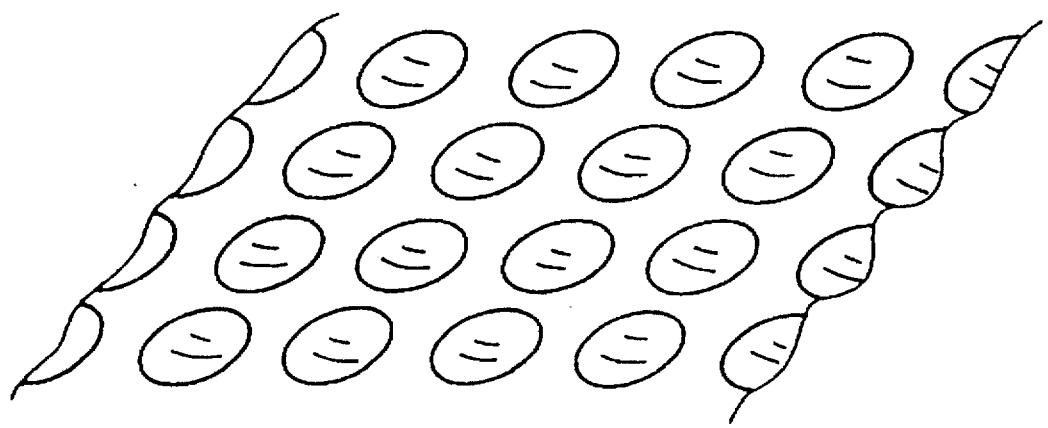
FIG. 3 is a perspective view showing the resist in hot melt condition.

Then, as FIG. 1B shows, on the silicon nitride layer 17 is formed by photolithography a photosensitive resist 18 such that a pixel portion opposite to the photoelectric conversion portion 1 is patterned to a through-open lattice configuration. The resist 18 is illustrated in FIG. 2 as being seen from an upper oblique direction. The resist 18 is formed of thermoplastic resin as represented by novolak resin. The resist 18 is hot-melted by baking at a temperature of about 180° C. and formed into a resist layer 19 having a concave micro-lens configuration as shown by a broken line in FIG. 1B. The resist layer 19, as it is after the hot melting, is shown in FIG. 3 as being seen from an upper oblique direction.

Figure 1C:
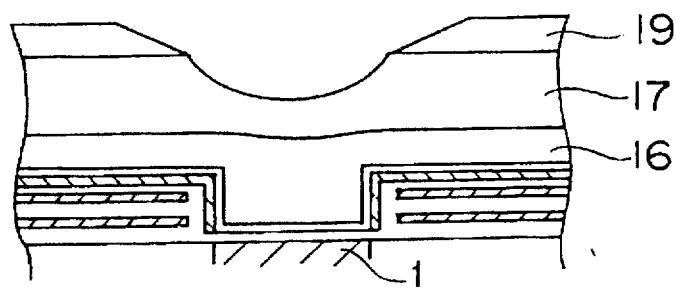

Subsequently, as FIG. 1C shows, the resist layer 19 is subjected to dry etching with a fluorine-based gas 20 (such as $CF_4+O_2$, $SF_6$, or $CHF_3+O_2$). By this dry etching is the concave micro-lens configuration of the resist layer 19 transferred to the silicon nitride layer 17 beneath the resist layer 19. Specifically, in the case of plasma etching with $SF_6$ at an output of about 200W, for example, the selection ratio is about 2:1 or more, and therefore a final configuration of the silicon nitride layer 17 may be such that the concave micro-lens configuration of the resist layer 19 is longitudinally twice extended.

Figure 1D:
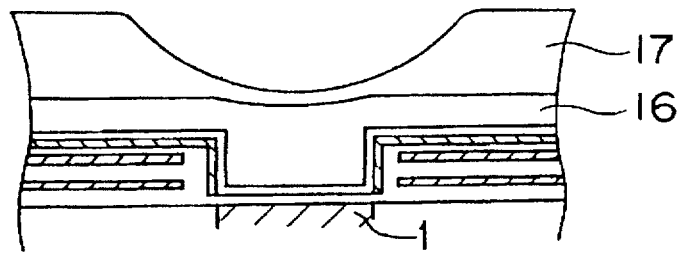

In FIG. 1D, the silicon nitride layer 17 which has been formed into a concave micro-lens is shown in its final configuration.

The manufacturing method illustrated in FIGS. 1A to 1D provides high reproducibility and good process stability. However, because of the fact that the leveling layer 16 formed from a glass material having a comparatively low refractive index (usually about 1.5) is sandwiched between a position immediately under the concave micro-lens 17 and the photoelectric conversion portion 1, the leveling layer 16 involves some possibility of lowering the collimating capability of the concave micro-lens 17.

Figure 1E:
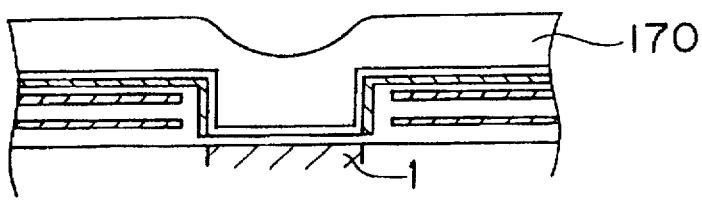

Therefore, to best utilize good step coverage of silicon nitride in vapor phase growth, the silicon nitride layer 17 may be formed immediately above the protective layer 5. In this case, as FIG. 1E shows, a pseudo concave micro-lens 170 having a thickness of about 2.0 μm can be obtained. By employing the transfer technique illustrated in FIGS. 1B and 1C in which the lattice pattern resist 18 is hot-melted and etched, the concave micro-lens 170 is patterned to an emphasized concave configuration so that the concave micro-lens 170 is configured to be as good as the concave micro-lens 17 shown in FIG. 1D. Thus, the micro-lens 170 can be formed into a concave micro lens having high collimation capability. Then, as shown in FIG. 9B, the surface of the concave micro-lens 170 is overcoated flat with a transparent leveling resin material 186, such as PMMA (polymethylmethacrylate), and then a convex micro-lens 197 is formed on the leveling resin surface in conventional manner, whereby the solid state imaging device of the invention is manufactured. The layer of transparent leveling resin material 186 is a supporting layer 186 for supporting a convex micro-lens 197 The concave micro-lens 170 is formed of a material having higher refractive index than either one of the supporting layer 186 and the convex micro-lens 197.

The solid state imaging device can collimate by means of the concave micro-lens 170 light rays of oblique incidence 199 shown in FIG. 9B on a virtual diaphragm 204 including electrodes, so that the oblique incident rays 199 can be made incident on the photoelectric conversion portion 207. Therefore, the solid state imaging device permits incidence on the photoelectric conversion portion 207 of light rays of oblique incidence 199 that have conventionally been subjected to be prevented by the diaphragm 204 and not made incident on the photoelectric conversion portion 207. Therefore, the solid state imaging device provides for sensitivity improvement.

The concave micro-lens 170 functions to substantially enlarge a field diaphragm which corresponds to a photoreceptor side aperture of the solid state imaging device, in a special optical system, such as micro-lenses, in any solid state imaging device.

The present solid state imaging device can convert a bundle of light rays into a bundle of parallel rays having a large sectional area of incidence on the photoelectric conversion portion 207 as shown in FIG. 9B, whereas with the prior art arrangement such a bundle of rays is normally converged on the surface of the photoelectric conversion portion.

With the solid state imaging device, therefore, the beam passage area 192 of the prior art arrangement shown in FIG. 8B can be enlarged to the beam passage area 202 as shown in FIG. 8D. This results in a decrease in the density of photons per unit volume in the beam passage area 202. Thus, any local oversaturation ($N_{SAT}$) shown in FIG. 8C of generated signal electrons can be prevented, so that any temporary decrease in the rate of photoelectric conversion can be prevented.

Since the solid state imaging device, as FIGS. 8D and 8E shows, can laterally broaden incident beam 210 parallel to the surface of the photoelectric conversion region 201, which has conventionally been not possible, photoelectric conversion can be effected in a peripheral edge part of the photoelectric conversion portion which involves a large potential gradient, that is, in a complete depleted area involving high migration probability. This results in improved photoelectric conversion efficiency.

With the above exemplified solid state imaging device, a light ray of small-angled oblique incidence 193 as shown in FIG. 8B which may be a cause of smears can be collimated by virtue of the concave micro-lens 170. Thus, possible smears can be reasonably reduced.

(Second Embodiment)

Figure 4A:
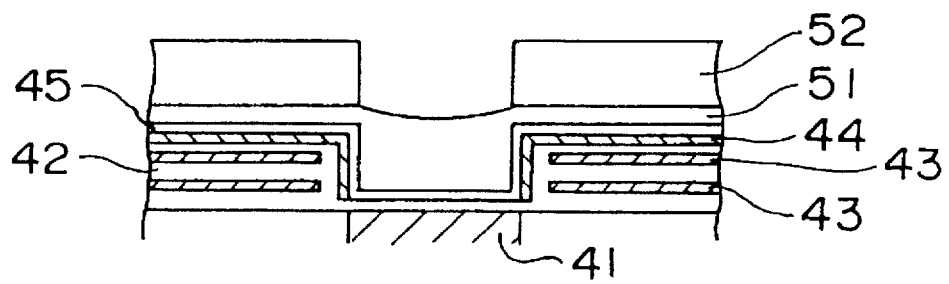
FIGS. 4A, 4B, and 4C are flow diagrams showing a second embodiment of the method of manufacturing a solid state imaging device according to the invention.
Figure 4B:
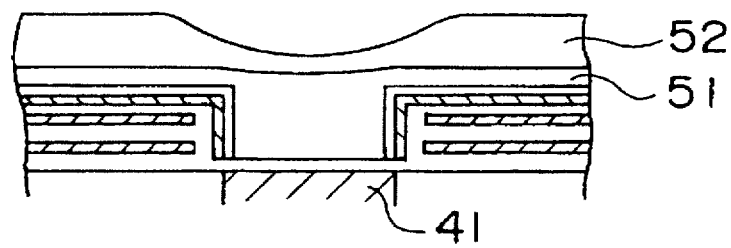
Figure 4C:
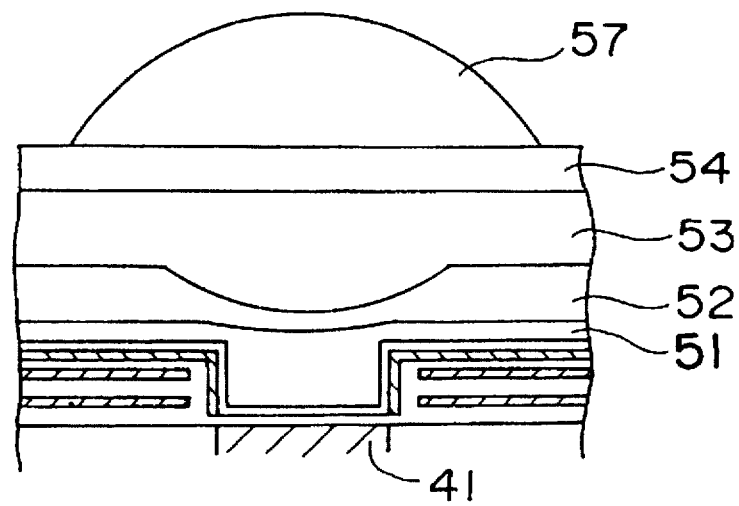

FIGS. 4A to 4C illustrate a second embodiment of the method of manufacturing a solid state imaging device of the invention, which is shown by way of flow diagrams for explaining the process of forming a concave micro-lens in a cell arrangement of a unit pixel.

As FIG. 4A shows, transfer electrodes 43 are first formed on a substrate including a photoelectric conversion portion 41, over a region which is not opposite to the photoelectric conversion portion 41, with the interposition of an interlayer insulating film 42. A shielding film 44 is provided for covering the transfer electrodes 43, and then a protective film 45 is provided for covering both the shielding film 44 and the photoelectric conversion portion 41. Then, in order to reduce surface irregularity due to the transfer electrodes 43 and the like, a leveling layer 51 formed from a resin material of high refractive index, such as polystyrene, is formed over the protective layer 45. The irregular surface is planarized through the formation of the leveling layer 51. Then, a concave lens layer 52 is formed. The concave lens layer 52 is formed to a lattice configuration by coating on the leveling layer 51 a photosensitive resin based on thermoplastic resin (with a critical temperature range of 120°-180° C., and a refractive index of 1.6 or more), such as novolac resin or polystyrene, using the spin coating technique or the like, then effecting patterning by lithography.

The concave lens layer 52 is typically configured to be of a lattice shape as shown in FIG. 2. However, where through-portions are made elliptical in shape and not rectangular, they will permit easy resolution even if they are arranged at a fine pitch. Further, as FIG. 4B shows, by hot melting the layer it is possible to easily obtain an ideal concave lens configuration.

The thickness of the concave lens layer 52 depends largely upon the geometry of the optical system, and may be finally determined on the basis of such geometry. From the standpoint of collimation capability, however, the thickness of the concave lens layer 52 is preferably at least 1 μm.

As FIG. 4B shows, the concave lens layer 52 is hot melted into a concave lens configuration. Thereafter, as FIG. 4C shows, a transparent, low refraction resin layer i.e. a leveling layer 53 having a lower refractive index than the concave lens layer 52 is formed on the concave lens layer 52.

The material of the low refraction resin layer 53 is subject to considerable limitation because of the low refractivity requirement. Refractivity depends largely upon the polarizability and molecular weight of component molecules, and the smaller these two factors the better for low refractivity purposes. Presently, transparent fluorine resins including "CYTOP", a product of Asahi Glass Co., Ltd., are known as those having a low refractive index of the order of about 1.34. However, such fluorine resin is water- and oil-repellent and, as may be apparent from this fact, it provides rather low surface energy and can only produce very low adhesion. Therefore, in order to provide increased adhesion, it is desirable that an adhesion reinforcing thin layer formed of surfactant or the like be placed in close adhesion contact with the low refraction resin layer 53.

A buffer layer 54 which is a support layer is formed on the low refraction resin layer 53. This buffer layer 54 is a very important layer which functions to effect good adhesion and other physicochemical matching with adjacent layers. The buffer layer 54 is preferably made of acrylic resin.

Finally, a convex micro-lens 57 is formed above the buffer layer 54.

The solid state imaging device manufactured according to this second embodiment which is shown in FIG. 4C, by virtue of the low refraction resin layer 53 present therein, can enhance the collimation effect of the concave lens layer 52.

(Third Embodiment)

Figure 5A:
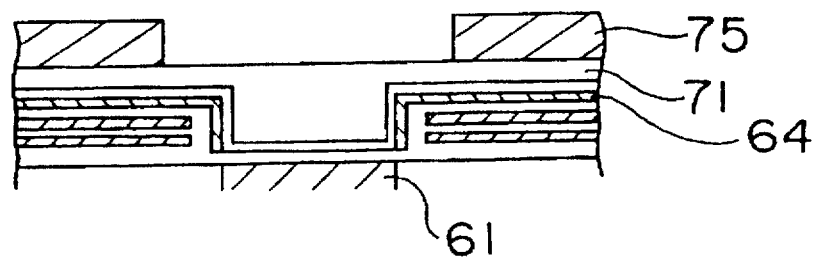
FIGS. 5A and 5B are flow diagrams showing a third embodiment of the method of manufacturing a solid state imaging device according to the invention.
Figure 5B:
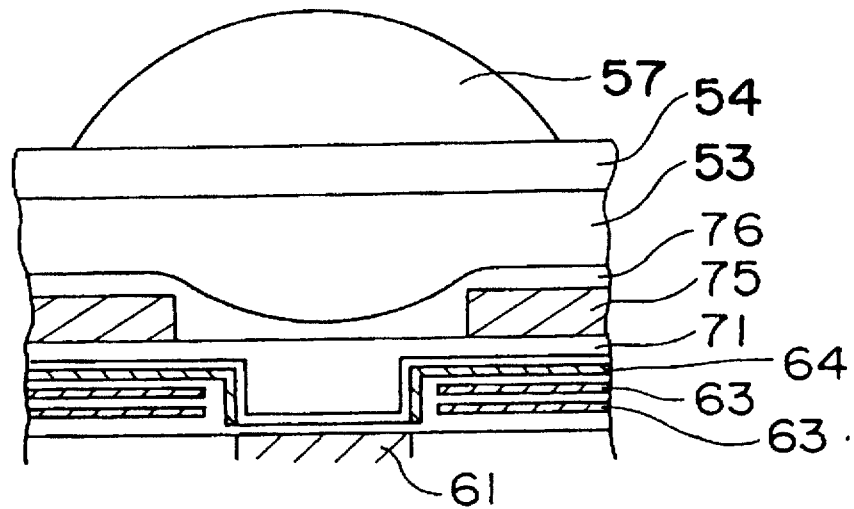

FIGS. 5A and 5B illustrate the process of forming a concave micro-lens in a cell arrangement of a unit pixel, which is a third embodiment of the method of manufacturing a solid state imaging device of the invention. This embodiment is identical with the above described second embodiment with respect to the steps of up to the forming of high refractivity leveling layer 71, and therefore the description of those steps is omitted.

In this embodiment, as FIG. 5A shows, a resist layer 75 of lattice pattern which serves as a base for a concave micro-lens layer is formed on the leveling layer 71. This resist layer 75 is pattern-formed by a photosensitive resist so as to surround an acceptance region opposite to a photoelectric conversion portion 61. A reference numeral 63 designates transfer electrodes.

Where the resist layer 75 is formed from a material containing a g-ray or i-ray absorbing dye, reflection from a shielding film 64 having high reflectance can be prevented during a lithographic operation in the step of micro-lens forming, it being thus possible to expect good anti-halation effect. In case that the resist layer 75 is formed from novolac resin, some g- and i-ray absorption effect can be had as well.

Subsequently, as FIG. 5B shows, a resin material having high refractivity (e. g., polystyrene) is overcoated by spin-coating or otherwise over the resist layer 75 and leveling layer 71 thereby to form a concave micro-lens layer 76. The concave micro-lens layer 76 is an overcoat layer. The formation of the concave micro-lens layer 76 can be controlled only by adjusting the line width of the resist pattern for the resist layer 75 and the viscosity of the high refractivity resin. This offers an advantage that the concave micro-lens layer 76 can be formed with comparatively good reproducibility.

Then, in the same way as in the second embodiment, a low refractivity resin layer 53 comprised of a resin material having a refractive index lower than the concave micro-lens layer 76, a buffer layer 54, and a convex micro-lens 57 are sequentially formed as shown in FIG. 5B. The process of manufacturing the solid state imaging device is thus completed.

(Fourth Embodiment)

FIGS. 7A through 7D illustrate the process of forming a concave micro-lens which represents a fourth embodiment of the method of manufacturing a solid state imaging device according to the invention.

Figure 7A:
FIGS. 7A, 7B, 7C and 7D are flow diagrams showing a fourth embodiment of the method of manufacturing a solid state imaging device according to the invention.
Figure 7A:
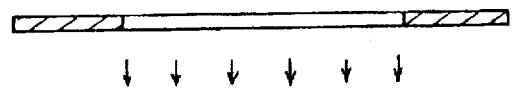
Figure 7B:
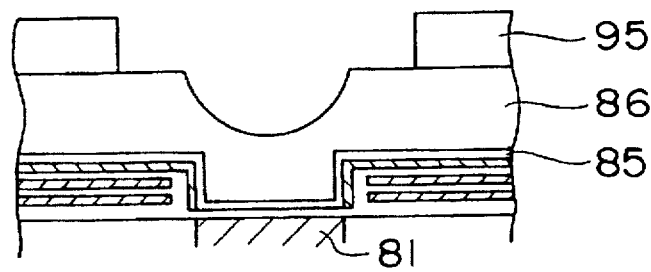

As FIG. 7A shows, a concave micro-lens 86 is formed on a protective layer 85 which overlies a photoelectric conversion portion 81, transfer electrodes 83, an interlayer insulating film 82, and a shielding film 84. A resist 95 made from same resin as the resist layer 75 in the third embodiment is deposited over the concave micro-lens 86, and the resist 95 is exposed by photolithography for being formed into a lattice pattern which surrounds an aperture portion opposite to the photoelectric conversion portion 81, as shown in FIG. 7B.

Then, as FIG. 7A shows, the resist 95, which has been formed to the lattice pattern, is sufficiently cured by heat treatment and otherwise.

Figure 7C:
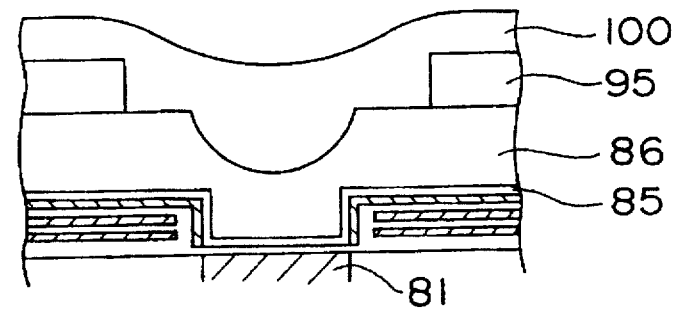

Then, as FIG. 7C shows, the surface of the resist 95 and the surface of the concave micro-lens 86 are overcoated with a low refractivity resin (e. g., "CYTOP") having a refractive index lower than the material of the lens 86, whereby a concave lens seat 100 is formed.

Figure 7D:
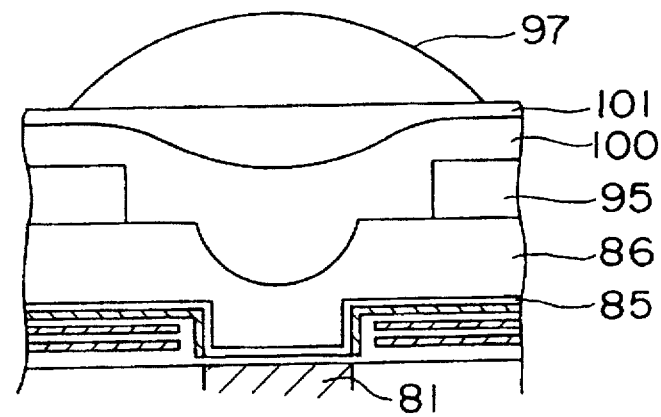

Then, as FIG. 7D shows, the surface of the concave lens seat 100 is overcoated with a high-refractivity resin (e. g., polystyrene) 101 of the type used as an overcoat material in the third embodiment, whereby the surface irregularity of the concave lens seat 100 is leveled. Then, a convex micro-lens 97 having a small curvature is formed on the resin 101.

The concave lens seat 100 is formed from a material having a refractive index lower than that of the constituent material of the convex micro-lens 97.

Figure 6A:
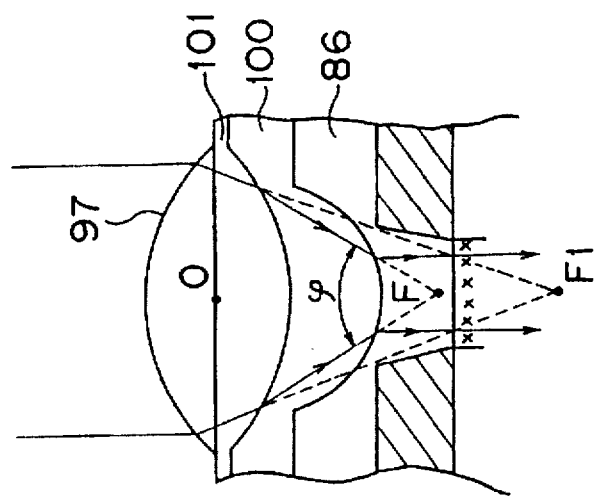
FIGS. 6A, 6B and 6C are diagrammatic representations including a conceptual views of the prior art and conceptual views of the present invention.
Figure 6B:
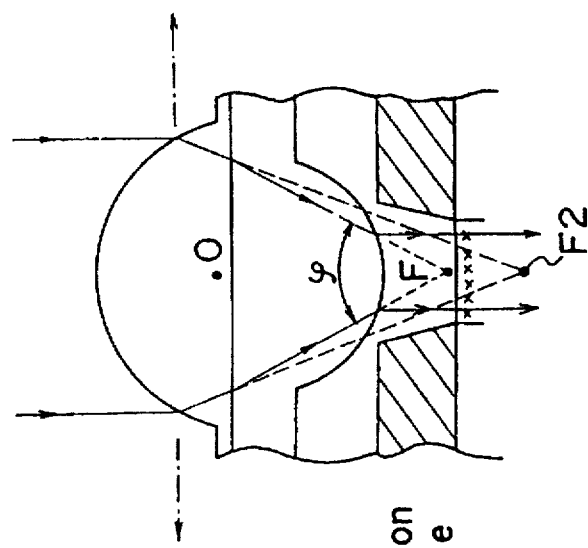
Figure 6C:
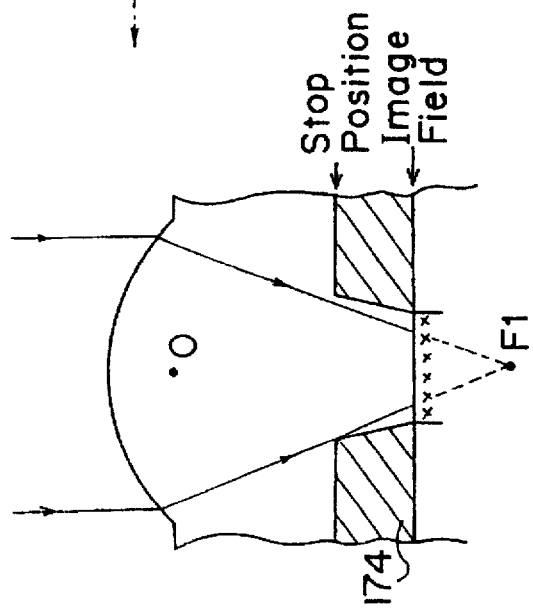

The concept of light-collecting mechanism of the solid state imaging device made according to the fourth embodiment will now be explained with reference to FIGS. 6A to 6C. FIG. 6A shows the concept of light collecting operation of the prior art arrangement, whereas FIG. 6B shows the concept of light collecting operation in the first to third embodiments and FIG. 6C shows the concept of light collecting operation in the fourth embodiment.

As FIG. 6A shows, the prior art device has a convex micro-lens with a comparatively small curvature defined by an elevation of less than 60° at edge portion. The curvature and effective focal length OF1 (distance between point O and point F1) of the convex micro-lens may take varying values, case by case.

It is an object of the invention to overcome the problem that incident light is prevented by a virtual diaphragm 174 including electrode side wells. Basic improvement concepts with respect to the problem of obstructing of incident light lie in that incident light rays be collected prior to the "stop position" shown in FIG. 6A in the forward direction of light travel, and in that the bundle of incident light rays be collimated from the "stop position" and up to the "image field".

Micro-lenses of the solid state imaging device do not come within the category of so-called imaging optics. That is, the micro-lenses of the solid state imaging device are special-type optics provided for conducting a radiation flux (the physical quantity of the flux is in the form of energy) to the photoelectric conversion region without loss.

From the view point of reducing any loss involved in the process of conducting incident light to the photoelectric conversion portion, the FIG. 6A arrangement involves the following three shortcomings (i)–(iii). That is, (i) since there is no optical waveguide means established, any oblique incident light is undoubtedly subject to loss due to the diaphragm 74; (ii) a long-focus lens system involves greater lateral magnification of an image which is closely related to focal length, and this results in an image becoming larger than field stop, which involves considerable inefficiency in the sense of light collecting, one important task of micro-lens optics; and (iii) in case that a greater lens curvature (as defined by an elevation of not less than 60° at lens edge portion) is adopted, reflection of incident light at lens surface can no longer be ignored.

Item (i) of the foregoing shortcomings can be reasonably corrected by the above described first and second embodiments of the invention. Item (ii) of the shortcomings can be overcome by increasing the curvature of the convex micro-lens as shown in FIG. 6B.

On the other hand, however, when the curvature of the convex micro-lens is increased as shown in FIG. 6B, reflected light at the lens surface results in considerable loss and, as such, item (iii) of the shortcomings cannot be overcome.

Therefore, the solid state imaging device made according to the fourth embodiment shown in FIG. 6C comprises a concave lens seat 100 made of a material of low refractive index (about 1.3) which is provided immediately under a support layer 101 and a convex micro-lens 97 of less curvature which are made of a material of high refractive index (about 1.6). The integration of the support layer 101 and the convex micro-lens 97 forms an convex micro-lens.

Referring to FIG. 6C, an optical system is obtained such that a light ray bundle comparable to that in FIG. 6B is refracted at the surface of the concave lens seat 100 so that it is focused at a virtual focal point F in case that there is present no concave micro-lens 86. In other words, the construction of FIG. 6C is such that the curvature of the uppermost surface of the convex micro-lens is smaller than that in FIG. 6B and yet the optics can have light collecting characteristics that are optically equal to the FIG. 6B optics. The reason for this is that the angle φ which peripheral light in FIG. 6C makes with the virtual focal point F is equal to the angle φ which peripheral light in FIG. 6B makes with the virtual focal point F.

In this way, according the arrangement of FIG. 6C, it is possible to reduce reflection at the surface of the convex micro-lens in comparison with the FIG. 6B arrangement, and also to achieve light collecting characteristics comparable to those of the FIG. 6B arrangement.

As can be clearly understood from the above description, the solid state imaging device of the invention comprises a support layer formed between a photoelectric conversion portion and a convex type micro-lens for supporting the convex type micro-lens, and a concave type micro-lens layer lying immediately under the support layer which is formed of a material having a refractive index higher than that of each material of the convex type micro-lens and the support layer.

Therefore, the solid state imaging device of the invention is designed so that the concave type micro-lens layer operates to collimate light rays collected by the convex lens so as to allow them to come closer to light rays incident vertically on the photoelectric conversion portion.

By collimating the collected light rays it is possible to prevent the collected rays from impinging on the diaphragm which surrounds a space present opposite to and above the photoelectric conversion portion. This results in sensitivity improvement.

Collimating the collected light rays also results in an increase in the area over which a beam composed of the collected light rays enters the photoelectric conversion portion. This, in turn, results in an increase in the effective utilization area of the photoelectric conversion portion and in increased sensitivity.

The solid state imaging device according the invention is so designed that the concave type micro-lens layer operates to collimate light rays collected by the convex lens so as to allow them to come closer to light rays incident vertically on the photoelectric conversion portion.

The refractive index of the material of the convex type micro-lens is higher than that of the material of the concave type lens seating layer, so that a bundle of light rays converged by the convex type micro-lens will in no case be diverged by the concave type lens seating layer. This provides for improvement in light collecting characteristics.

Because the concave type lens seating layer made of the material having lower refractive index relative to the support layer is provided immediately under the support layer, the curvature of the convex micro-lens can be made smaller than in case of no such concave type lens seating layer being provided, without involving any increase in focal distance. Therefore, reflection of incident light from the surface of the convex micro-lens can be reasonably prevented.

According to the method of manufacturing a solid state imaging device of the invention, a lattice pattern layer is hot melted for being formed into a concave type micro-lens pattern layer, and then the concave type micro-lens pattern layer is etched so that a concave micro-lens configuration is transferred onto a flat layer for provision of a concave type micro-lens layer. The solid state imaging device of the invention is thus manufactured.

According to the method, a lattice pattern layer is hot melted so that the lattice pattern layer is formed into a concave type micro-lens layer. Thus, the solid state imaging device of is manufactured.

According to the method, an overcoat layer made of transparent resin is formed on a lattice pattern layer so that the overcoat layer may be operative to be a concave type micro-lens layer. Therefore, the concave type micro-lens layer can be formed without involving the step of hot melting the lattice pattern layer. This permits formation of the concave type micro-lens layer with good reproducibility.

As is apparent from the foregoing, the solid state imaging device of the invention, as FIGS. 8D and 8E show, allows efficient photoelectric conversion of an incident beam and inhibits incidence of oblique light rays upon the photoelectric conversion portion that may be a cause of a smear, because it has a collimator disposed immediately above the photoelectric conversion portion. Also, as FIG. 9B shows, by avoiding the impinging of oblique incident light rays, it is possible to achieve general sensitivity improvement and inhibition of smears simultaneously.

Furthermore, by incorporating an outermost convex type micro-lens having reduced curvature in combination with a concave lens seat having a low refractive index, it is possible to suppress surface light reflection without detriment to the light collecting characteristics.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid state imaging device having a plurality of pixels including a photoelectric conversion portion and a convex type micro-lens disposed above the photoelectric conversion portion, the device comprising:

a support layer formed between the photoelectric conversion portion and the convex type micro-lens for supporting the convex type micro-lens; and a concave type micro-lens layer disposed between the support layer and the photoelectric conversion portion, said concave type micro-lens layer being formed of a material having a refractive index higher than that of the support layer and further comprising a concave type lens seating layer disposed between the concave type micro-lens layer and the support layer for supporting the support layer; and wherein material of the convex type micro-lens, that of the support layer, and that of the concave type micro-lens layer being all designed to have a refractive index higher than that of material of the concave type lens seating layer.

2. A solid state imaging device having a plurality of pixels including a photoelectric conversion portion and a convex type micro-lens disposed above the photoelectric conversion portion, the device comprising:

a support layer formed between the photoelectric conversion portion and the convex type micro-lens for supporting the convex type micro-lens, said support layer being formed of a material having a refractive index lower than that of the convex type micro-lens; and a concave type micro-lens layer disposed between the support layer and the photoelectric conversion portion, said concave type micro-lens layer being formed of a material having a refractive index higher than that of the support layer.

3. A solid state imaging device as shown in claim 2, wherein the material of the concave type micro-lens layer has a higher refractive index than the convex type micro-lens.

* * * * *

UNITED STATES PATENT AND TRADEMARK OFFICE
CERTIFICATE OF CORRECTION

PATENT NO. : 5,691,548
DATED : November 25, 1997
INVENTOR(S) : Tetsuro Aoki

It is certified that error appears in the above-identified patent and that said Letters Patent is hereby corrected as shown below:

On the title page item [19], should read --Aoki--

On the title page item [75], should read -- Tetsuro Aoki, Fukuyama, JAPAN --

Signed and Sealed this

Third Day of March, 1998

Attest:

BRUCE LEHMAN

Attesting Officer

Commissioner of Patents and Trademarks